(12) United States Patent
Honda

(10) Patent No.: US 7,074,650 B2
(45) Date of Patent: Jul. 11, 2006

(54) FLIP-CHIP TYPE SEMICONDUCTOR DEVICE AND METHOD OF MANUFACTURING THE SAME

(75) Inventor: Hirokazu Honda, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 17 days.

(21) Appl. No.: 10/761,510

(22) Filed: Jan. 21, 2004

(65) Prior Publication Data

US 2004/0169287 A1 Sep. 2, 2004

Related U.S. Application Data

(62) Division of application No. 09/789,864, filed on Feb. 21, 2001, now Pat. No. 6,734,566.

(30) Foreign Application Priority Data

Feb. 21, 2000 (JP) ............................. 2000-043665

(51) Int. Cl.
*H01L 21/44* (2006.01)

(52) U.S. Cl. ...................... 438/108; 438/106; 438/118; 438/125

(58) Field of Classification Search ................ 257/777; 438/106, 108
See application file for complete search history.

(56) References Cited

U.S. PATENT DOCUMENTS

| 5,547,740 A | 8/1996 | Higdon et al. |
| 5,847,456 A | 12/1998 | Shoji |
| 6,249,044 B1 * | 6/2001 | Kao et al. ................... 257/678 |

FOREIGN PATENT DOCUMENTS

| JP | 06-177134 | 6/1994 |
| JP | 11-219981 | 8/1999 |
| WO | 99/56312 | 11/1999 |

\* cited by examiner

*Primary Examiner*—Thao P. Le
(74) *Attorney, Agent, or Firm*—Katten Muchin Rosenman LLP

(57) ABSTRACT

In a flip-chip type semiconductor device, a pad electrode and a passivation film are formed on a semiconductor substrate. An insulating resin layer is formed on the passivation film, and an opening is formed above the electrode. A pad electrode adhesive metal film is formed on the substrate like a re-wiring pattern, and a plating feed layer metal film and a Cu plating layer are sequentially formed on the metal film to form a wiring layer. A metal post electrode is formed on the wiring layer. A solder bump is formed on the post electrodes, a support plate in which holes each having a diameter larger than the diameter of the solder bump are formed at positions adjusted to the solder bumps is arranged, and an insulating resin layer is formed between the support plate and the semiconductor substrate. Therefore, a stress acting on the solder bump is moderated.

12 Claims, 16 Drawing Sheets

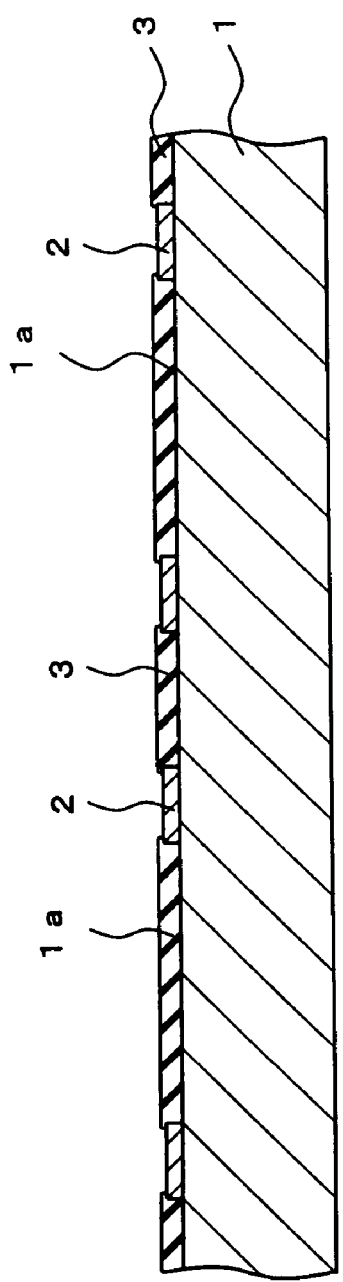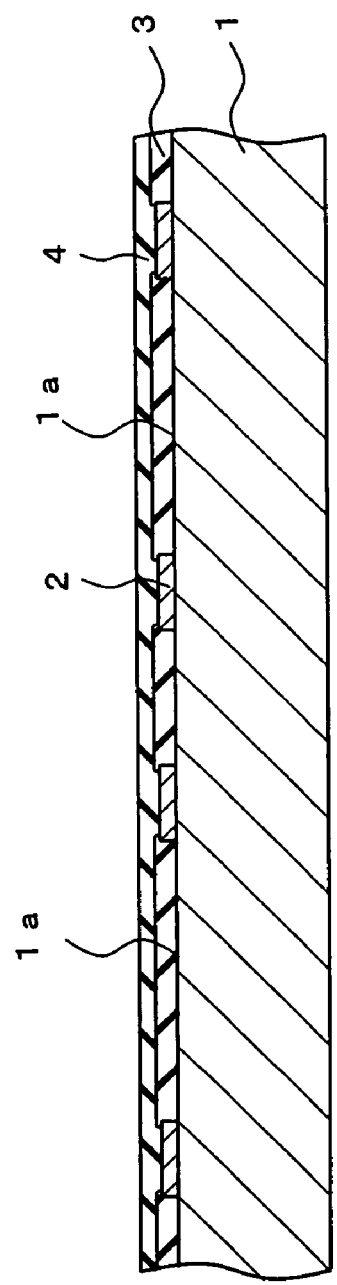
FIG.5A
FIG.5B

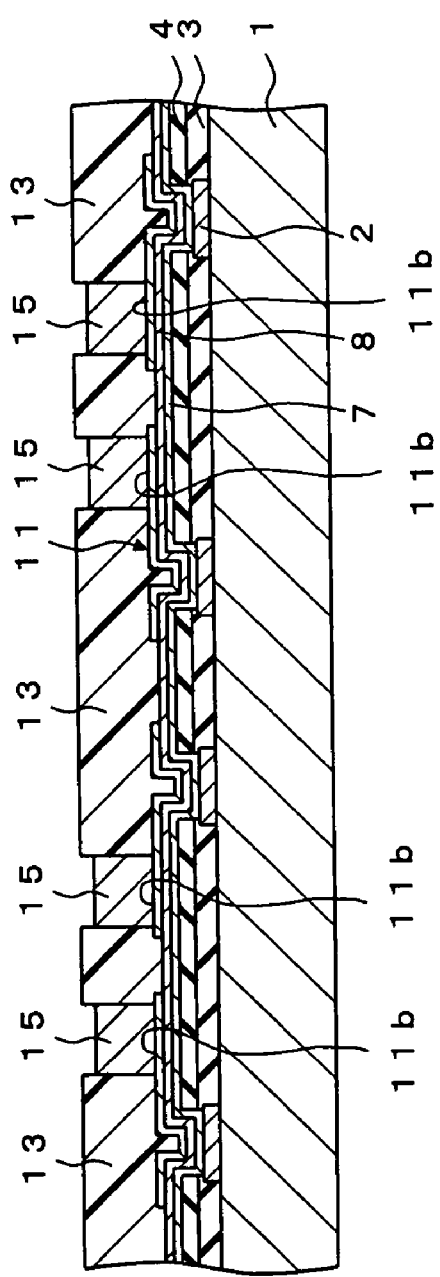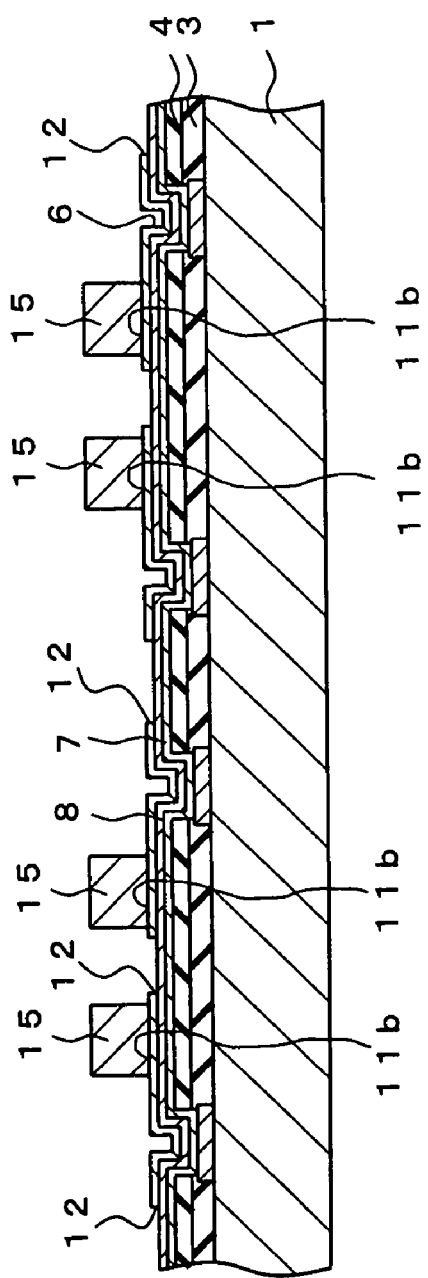
FIG. 10A
FIG. 10B

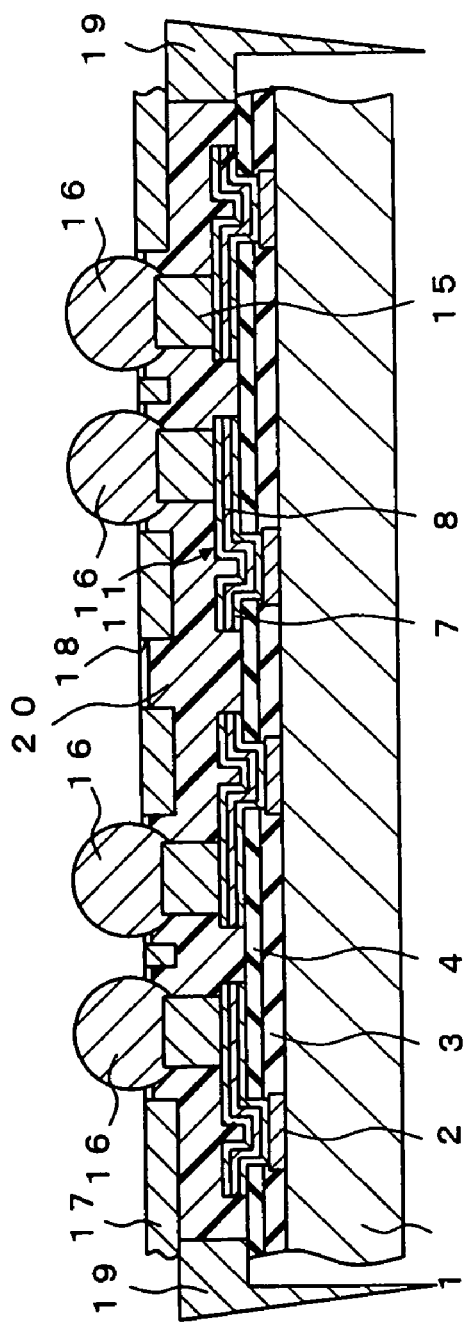
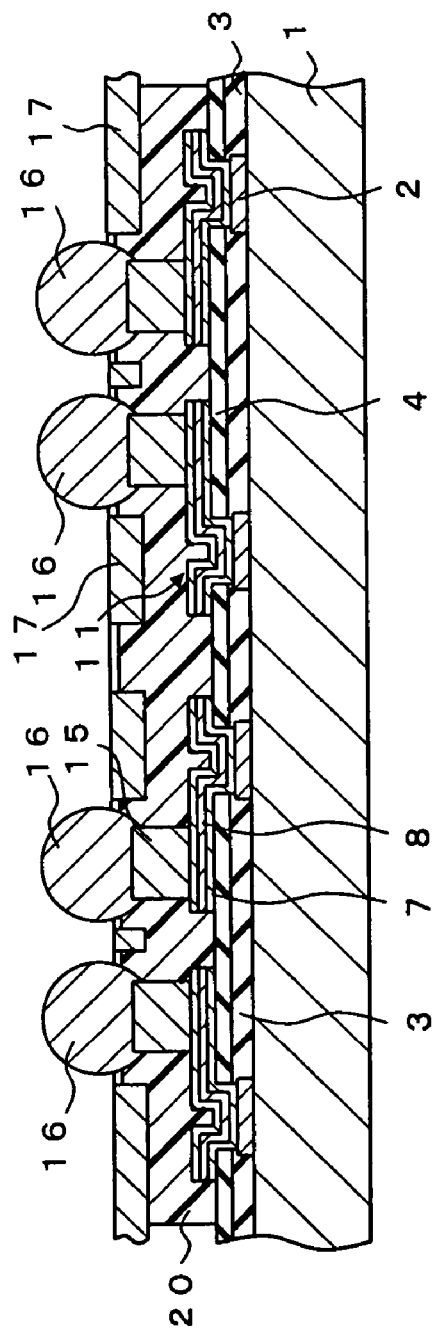
FIG.13A
FIG.13B

US 7,074,650 B2

FLIP-CHIP TYPE SEMICONDUCTOR DEVICE AND METHOD OF MANUFACTURING THE SAME

CROSS-REFERENCE TO RELATED APPLICATION

This application is a Divisional Application of application ser. No. 09/789,864, filed on Feb. 21, 2001, now U.S. Pat. No. 6,734,566 which claimed foreign priority of Japan application No. 2000-043665 file Feb. 21, 2000.

BACKGROUND OF THE INVENTION

1. Field of the Invention

The present invention relates to a flip-chip type semiconductor device obtained by mounting a semiconductor chip on a multi-layered wiring substrate and a manufacturing method of the same and, more particularly, to a flip-chip type semiconductor device which can be recycled, has high mounting reliability, and can be manufactured at a low cost and a method of manufacturing the same.

2. Description of the Related Art

FIG. 1A is an illustration showing a conventional flip-chip type semiconductor device, and FIG. 1B is an illustration showing a mounting state of a conventional flip-chip type semiconductor device.

As shown in FIG. 1A, in a conventional flip-chip type semiconductor device 100, projecting solder bumps 101 consisting of a solder or a metal material such as Au or an Sn—Ag-based alloy are formed on external terminals which are provided in area array arrangement on a peripheral portion or an active region of a chip.

The flip-chip type semiconductor device 100 is mounted on a multi-layered wiring substrate 102 (mounting substrate) on which electrode pads (not shown) are formed in the same pattern as the bump arrangement pattern of the flip-chip type semiconductor device 100 on the side of an end user. When the flip-chip type semiconductor device 100 is mounted on the multi-layered wiring substrate 102, if a bump material is a solder, the flip-chip type semiconductor device 100 is mounted by an IR reflow (infrared reflow) process using a flux.

However, after the conventional flip-chip type semiconductor device 100 is mounted on the multi-layered wiring substrate 102, due to incoincidence (mismatch) between linear expansion coefficients of the multi-layered wiring substrate 102 and the flip-chip type semiconductor device 100, especially, the temperature cycle characteristics of the mounting reliability are degraded disadvantageously. In order to solve the problem, the following measure is conventionally performed.

In order to make the linear expansion coefficient of the multi-layered wiring substrate close to the linear expansion coefficient of silicon, a ceramic-based material such as AlN, mullite, or glass ceramics which is substantially expensive among a material is used to minimize the mismatch between the linear expansion coefficients, thereby performing an attempt to improve the mounting reliability. This attempt is effective from the viewpoint of improvement in mounting reliability. However, since the expensive ceramic-based material is used as the material of the multi-layered wiring substrate, the application of the measure is limited to a super computer, a large-scale computer, or the like which is generally maximally expensive.

In contrast to this, in recent years, the following technique is proposed. That is, an under fill resin is arranged between a semiconductor chip and a multi-layered wiring substrate which is relatively low in cost and which uses an organic material having a large linear expansion coefficient to construct a flip-chip semiconductor device, so that mounting reliability can be improved. In this manner, the under fill resin is arranged between a semiconductor chip and a multi-layered wiring substrate using an organic material, so that a shearing stress acting on a bump joint portion existing between the semiconductor chip and the multi-layered wiring substrate using the organic material is dispersed, and the mounting reliability can be improved. When the under fill resin is interposed between the semiconductor chip and the multi-layered wiring substrate using the organic material, a multi-layered wiring substrate using an inexpensive organic material can be used.

However, in this conventional technique, when a void exists in the under fill resin, or when the adhesive characteristics of an interface between the under fill resin and the semiconductor chip and an interface between the under fill resin and the multi-layered wiring substrate using an organic material are poor, in a moist absorption reflow process of a product, a peeling phenomenon occurs on the interface, and a defective product is manufactured disadvantageously. For this reason, the conventional technique cannot reliably advance a reduction in cost of a flip-flop type semiconductor device.

In addition, since a flip-chip type semiconductor chip is generally used in an LSI having high performance, the products itself is expensive. Therefore, when a portion except for the semiconductor chip is defective in an electric selection process performed after the flip-chip type semiconductor chip is mounted on a multi-layered wiring substrate, non-defective semiconductor chip must be recycled. However, when an under fill resin is interposed between the semiconductor chip and the multi-layered wiring substrate using an organic material, the semiconductor chip cannot be recycled. In this case, since peripheral devices including the multi-layered wiring substrate using the organic material become defective, a reduction in cost can hardly be always advanced by using the multi-layered wiring substrate using the organic material.

On the other hand, when a ceramic-based multi-layered wiring substrate is used in a semiconductor chip, the linear expansion coefficient of the ceramic-based material is optimized to eliminate the necessity of an under fill resin. For this reason, a recycle process for a non-defective semiconductor chip can be relatively made easy.

FIG. 2A is an illustration showing a removing method of a flip-chip type semiconductor device, and FIG. 2B is an illustration showing the flip-chip type semiconductor device after the removal. When a semiconductor device 100 is to be recycled, a heating absorption tool 103 absorbs the semiconductor device 100 by sucking the semiconductor device 100 by means of a vacuum device (not shown) connected to an exhaust pipe 104 formed in the heating absorption tool 103, and the semiconductor device 100 is heated to a high temperature by a heater 105 to melt solder bumps 101 on the rear surface of the semiconductor device 100, thereby drawing the semiconductor device 100 from the multi-layered wiring substrate 102. In this manner, the non-defective semiconductor device 100 can be removed.

However, when the semiconductor device 100 is removed, the semiconductor device 100 is heated to a high temperature. For this reason, a passivation film consisting of a polyimide (PI)-based organic material or an inorganic material such as SiO and formed to protect the solder bumps 101*a* of the removed semiconductor device 100 or the barrier metal joint portion between the solder bumps 101 and the semiconductor device 100, and the active region of the semiconductor device 100 is damaged. For this reason, the non-defective semiconductor chip may be defective. In this manner, due to the above-described problem, it is difficult to recycle a non-defective flip-chip type semiconductor chip in the conventional technique.

SUMMARY OF THE INVENTION

It is an object of the present invention to provide a flip-chip type semiconductor device which can be recycled, has high mounting reliability, and can be manufactured at a low cost and a method of manufacturing the same.

A flip-chip type semiconductor device according to the present invention includes a semiconductor substrate, a pad electrode formed on the semiconductor substrate, an insulating film formed on the entire surface of the semiconductor substrate to be opened above the pad electrode, a wiring portion patterned on the pad electrode and the insulating film, an electrode formed on the wiring portion, a metal bump formed on the electrode, a support plate in which holes each having a diameter larger than the diameter of the metal bump are formed at positions adjusted to the metal bumps and which is arranged such that the metal bumps project with an appropriate interval above the semiconductor substrate, and an insulating resin layer formed to bury the electrode between the semiconductor substrate and the support plate.

In the present invention, since the insulating resin layer is formed on the semiconductor substrate, even though a thermal stress or a mechanical stress acts on the metal bump, the stress acting on the metal bump can be moderated by the elasticity of the insulating resin layer. For this reason, an active region or the like formed on the semiconductor substrate can be more protected, and the mounting reliability of the semiconductor device is improved. In addition, since an under fill resin is not used unlike a conventional device, the semiconductor device can be recycled without damaging peripheral devices including the multi-layered wiring substrate. Furthermore, since the metal bump is formed on the electrode buried in the insulating resin layer to project from the surface of the support plate, the height between the semiconductor substrate and the metal bump can be increased. For this reason, when the semiconductor device is mounted on a multi-layered wiring printed board or the like, a standoff height which is the interval between the semiconductor substrate and the multi-layered wiring printed board can be increased. Therefore, when the semiconductor substrate and the multi-layered wiring printed board are offset due to the mismatch between the linear expansion coefficients of the semiconductor substrate and the multi-layered wiring printed board, the offset can be reduced. Especially the temperature cycle characteristics of the mounting reliability can be improved.

In the present invention, the periphery of the joint portion between the metal bump and the electrode is preferably covered with the insulating resin layer. In this manner, since the joint portion between the metal bump and the electrode is reinforced, the mechanical strength of the joint portion of the metal bump is improved to improve protection properties against an external stress.

Furthermore, in the present invention, for example, the support plate can be made of a conductive material, an insulating film and a metal film can be formed on the support plate in the order named, and a metal bump, having a ground potential, of the metal bumps can be connected to the metal film with a conductive adhesive agent. For example, the support plate can be made of an insulating material, a metal film can be formed on the surface of the support plate, and a metal bump, having a ground potential, of the metal bumps can be connected to the metal film with a conductive adhesive agent. In this manner, since the metal film can be used as a GND plane function, the following electric characteristics can be improved. That is, a GND inductance in a package form can be reduced, EMI (Electromagnetic wave impedance) shield effect can be improved, and crosstalk noise can be reduced.

In addition, in the present invention, the insulating resin layer preferably contains at least one resin selected from the group consisting of an epoxy-based resin, a silicon-based resin, a polyimide-based resin, a polyolefin-based resin, a cyanate ester-based resin, a phenol-based resin, a naphthalene-based resin, and a fluorene-based resin.

In addition, in the present invention, the insulating film can be made of a photosensitive material. Further, the insulating film preferably has a thermal decomposition temperature of 200° C. or more.

In a method of manufacturing a flip-chip type semiconductor device according to the present invention, a pad electrode is formed on a semiconductor substrate. An insulating film is formed on the entire surface of the semiconductor substrate, and the part of the insulating film that is on the pad electrode is removed to form an opening. A metal thin film layer is formed on the entire surface of the semiconductor substrate and the metal thin film layer is patterned to form a wiring portion. A resist film is formed on the entire surface of the semiconductor substrate. The resist film is patterned to remove the resist film on the wiring portion, and an electrode is formed in the opening. A metal bump is formed on the electrode. A support plate is arranged above the semiconductor substrate with an appropriate interval between the support plate and the semiconductor substrate. In the support plate, holes each having a diameter larger than the diameter of the metal bump are formed at positions adjusted to the positions where the metal bumps are arranged. An insulating resin is injected between the semiconductor substrate and the support plate.

In the present invention, since packages can be manufactured by the process in the state of a semiconductor device, the number of steps can be considerably reduced in comparison with a packaging method in which packages are manufactured from a conventional state of small pieces so that the cost can be considerably reduced.

In the present invention, the support plate can be made of a conductive material, an insulating film and a metal film can be formed on the support plate in the order named, and a conductive adhesive agent can be buried into the hole of the support plate located at the metal bump, having the ground potential, of the metal bumps.

Furthermore, the present invention preferably includes the step of burying a conductive adhesive agent into the hole of the support plate located at the metal bump, having the ground potential, of the metal bumps when the support plate is made of an insulating material and a metal film is formed on the surface of the support plate.

Still furthermore, in the present invention, the step of arranging the support plate above the semiconductor substrate is to place the support plate on jigs arranged at both the ends of the semiconductor substrate and each having an appropriate interval thickness.

BRIEF DESCRIPTION OF THE DRAWINGS

FIGS. 5A and 5B are sectional views sequentially showing the steps in a method of manufacturing a flip-chip type semiconductor device according to this embodiment;

FIGS. 10A and 10B are sectional views sequentially showing the steps next to the steps in FIGS. 9A to 9C;

FIGS. 13A and 13B are sectional views sequentially showing the steps next to the steps in FIGS. 12A and 12B;

DESCRIPTION OF THE PREFERRED EMBODIMENT

Figure 1A:
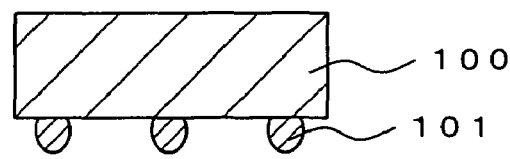
FIG. 1A is an illustration showing a conventional flip-chip type semiconductor device.
Figure 1B:
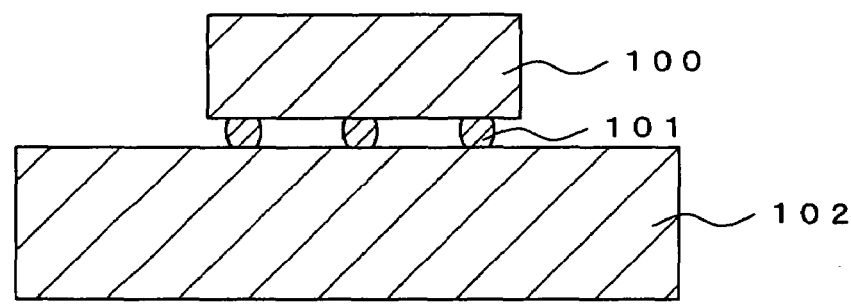
FIG. 1B is an illustration showing a mounting state of a conventional flip-chip type semiconductor device.
Figure 2A:
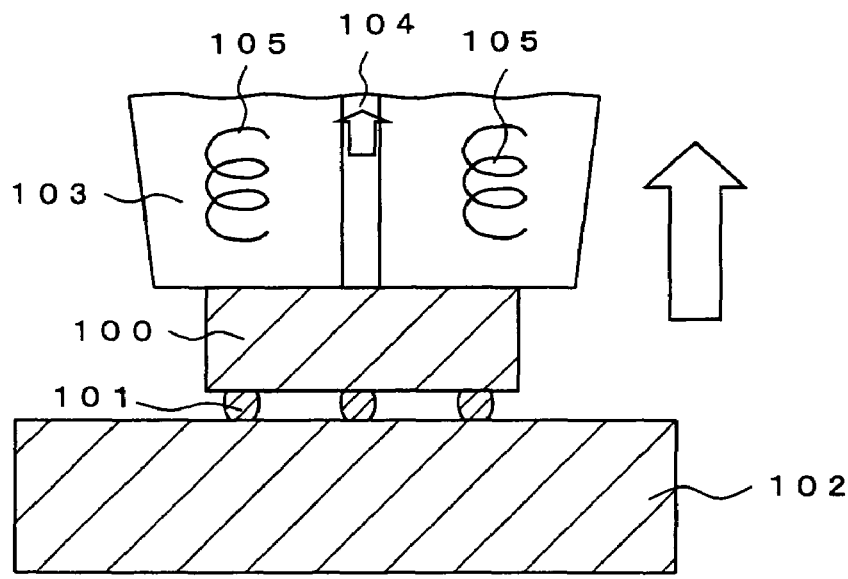
FIG. 2A is an illustration showing a method of removing a flip-chip type semiconductor device.
Figure 2B:
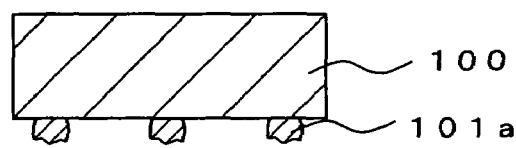
FIG. 2B is an illustration showing the flip-chip type semiconductor device after the removal.
Figure 3:
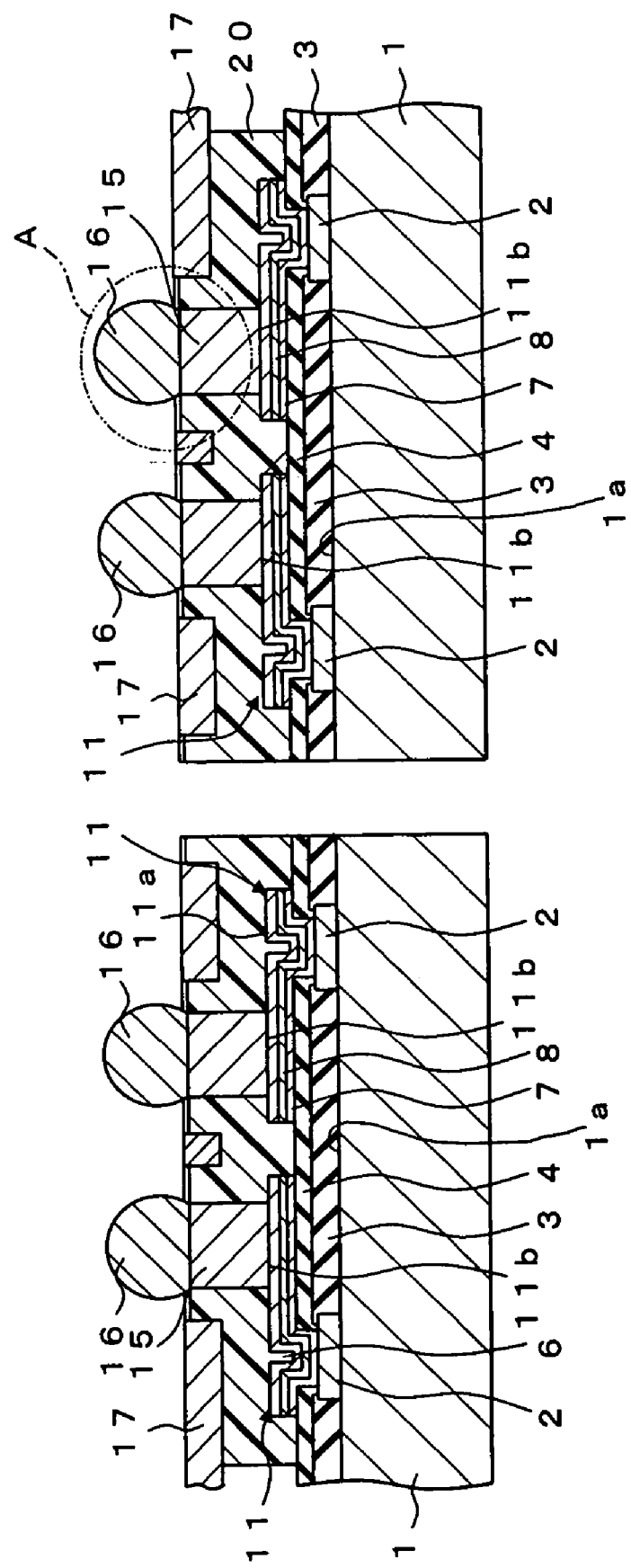
FIG. 3 is a sectional view showing a flip-chip type semiconductor device according to the first embodiment of the present invention.
Figure 4:
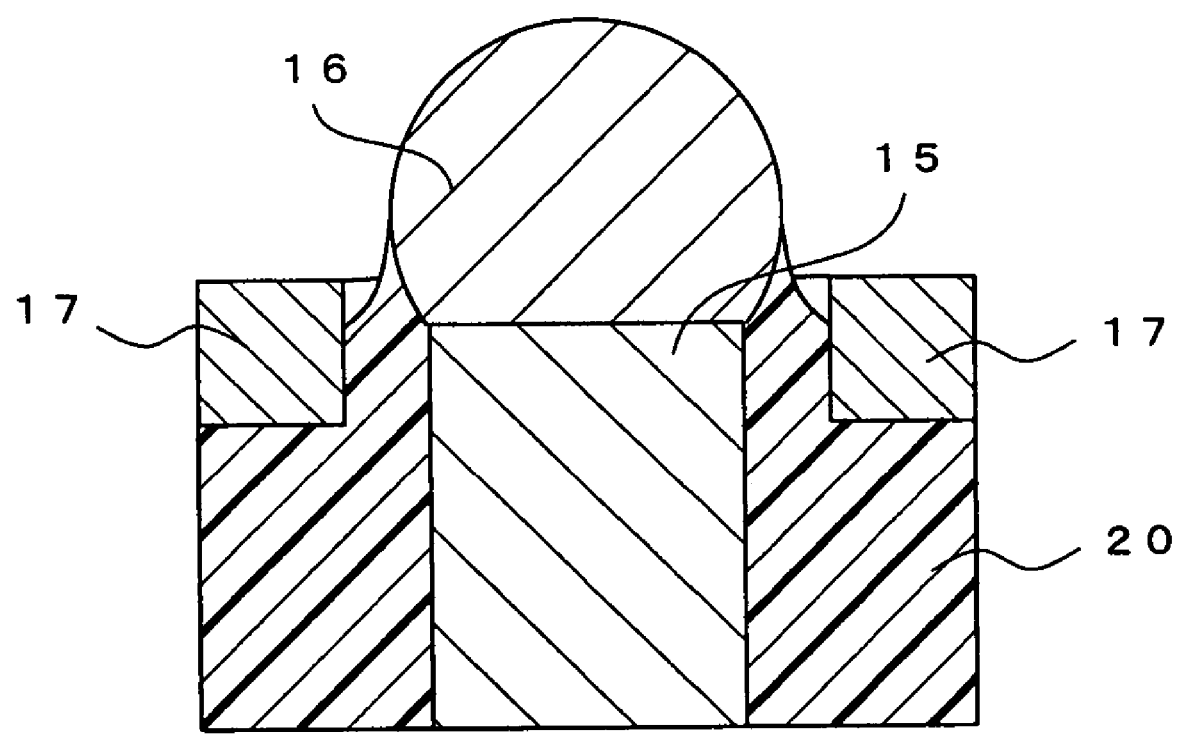
FIG. 4 is an enlarged view of a section A in FIG. 3.

A flip-chip type semiconductor device according to an embodiment of the present invention and a method of manufacturing the same will be described below with reference to the accompanying drawings. FIG. 3 is a sectional view showing a flip-chip type semiconductor device according to the first embodiment of the present invention, and FIG. 4 is an enlarged view of a section shown by two-dot chain line A in FIG. 3. In the flip-chip type semiconductor device of this embodiment, pad electrodes 2 are formed on the semiconductor substrate 1 as external terminal electrodes such that the pad electrodes 2 are located on the peripheries of chips in units of chips. The portion of the semiconductor substrate 1 that is between the pad electrodes 2 serves as an active region 1a. A passivation film 3 is formed on the active region 1a and an outer edge portion of the semiconductor substrate 1. An insulating resin layer 4 for protecting a re-wiring layer is formed on the passivation film 3. An opening 6 is formed above the pad electrode 2.

A pad electrode adhesive metal film 7, a plating feed layer metal film 8, and a Cu plating layer 11 are sequentially formed as a wiring layer on the pad electrode 2 and the insulating resin layer 4 in the order named. This wiring layer is patterned like a re-wiring pattern to form a re-wiring pattern portion 11a. In the re-wiring pattern portion 11a, an external terminal forming land portion 11b is formed.

A metal post electrode 15 is formed on the external terminal forming land portions 11b located on the active region 1a. A solder bump 16 is formed on each of the metal post electrode 15. As shown in FIG. 4, a support plate 17 in which a hole having a diameter larger than the diameter of the solder bump 16 is formed at a position adjusted to the solder bump 16 is formed with an appropriate interval to the semiconductor substrate 1 such that the solder bump 16 projects from the support plate 17. An insulating resin layer 20 is formed between the support plate 17 and the semiconductor substrate 1 to buffer a stress acting on the solder bump 16. The electrodes 2 are connected to corresponding electrodes of a mounting substrate through the solder bumps 16.

In this embodiment, the insulating resin layer 20 is formed on the passivation film 3 of the flip-chip type semiconductor device. For this reason, when a heating absorption tool is used to recycle a semiconductor device as described above, even though a thermal stress and a mechanical stress act on the solder bump 16, these stresses are buffered by the elasticity of the insulating resin layer 20, and the passivation film 3 and the active region 1a are protected effectively more than a conventional semiconductor device, so that mounting reliability is improved. Therefore, a flip-chip type semiconductor device which can be recycled can be provided. In addition, since an under fill resin is not used unlike a conventional device, the semiconductor device can be recycled without damaging peripheral devices or the like including a multi-layered wiring substrate.

In this embodiment, since the solder bump 16 which is formed to be mounted on a printed wiring board on an end user side is formed on the metal post electrode 15 surrounded by the insulating resin layer 20, a standoff height can be increased. For this reason, when heat or the like is applied to the semiconductor device while the semiconductor device is mounted on the multi-layered wiring printed board, even though the semiconductor substrate 1 and the multi-layered wiring printed board are offset due to the mismatch between the linear expansion coefficients of the semiconductor substrate 1 and the multi-layered wiring printed board, the offset can be reduced. Therefore, a stress acting on the solder bump 16 can be reduced, and peeling or the like of the substrate can be prevented. In this manner, the mounting reliability can be improved. In particular, temperature cycle characteristics can be improved.

In addition, in this embodiment, since the lower portion of the solder bump 16 formed on the metal post electrode 15 and the periphery of the joint portion between the solder bump 16 and the metal post electrode 15 are covered with an insulating resin, the joint portion between the metal post electrode 15 and the solder bump 16 is reinforced by the insulating resin layer 20, the mechanical strength of the solder bump 16 itself and the protection effect against an external stress are improved due to the reinforcement effect by this resin layer 20. For this reason, the mounting reliability for a board in a final package form is improved. In this manner, in this embodiment, the standoff height can-be increased, and a stress buffer effect obtained by the insulating resin layer 20 can be added. For this reason, since a stress acting on the solder bump 16 can be more moderated, a flip-chip type semiconductor device having high mounting reliability can be provided.

A method of manufacturing a flip-chip type semiconductor device according to the embodiment of the present invention will be described below. FIGS. 5A and 5B, FIGS. 6A to 6C, FIGS. 7A to 7C, FIGS. 8A to 8C, FIGS. 9A to 9C, FIGS. 10A and 10B, FIGS. 11A and 11B, FIGS. 12A and 12B, FIGS. 13A and 13B, and FIG. 14 are sectional views sequentially showing steps in the method of manufacturing a flip-chip type semiconductor device according to the embodiment of the present invention.

As shown in FIG. 5A, on the semiconductor substrate 1, as external terminal electrodes, the pad electrodes 2 made of, e.g., Al, Cu, or the like are formed in units of semiconductor chips to be located at the outer peripheries of the semiconductor chips. The passivation film 3 made of, e.g., an inorganic material such as $SiO_2$ or an organic material such as polyimide is formed on the outer peripheries of the pad electrodes 2 and the active region 1a.

As shown in FIG. 5B, the insulating resin layer 4 consisting of, e.g., an organic material such as polyimide is formed on the pad electrodes 2 and the passivation film 3. By the insulating resin layer 4, a function for protecting a re-wiring layer (which will be formed later) is achieved. If the insulating resin layer 4 contains a material including a thermosetting component, the cross-linking reaction of the resin component is advanced, and a heating process is performed at a predetermined temperature to obtain a physical value. As the material of the insulating resin layer 4, a resin material having a thermal decomposition temperature of 200° C. or more is preferably used. When the thermal decomposition temperature of the insulating resin layer 4 is 200° C. or more, during formation of the solder bump 16, the connection between the pad electrodes 2 and the Cu plating layer 11 is not prevented by thermal decomposition occurring when the insulating resin layer 4 is heated to 200° C. and reflowed.

Figure 6A:
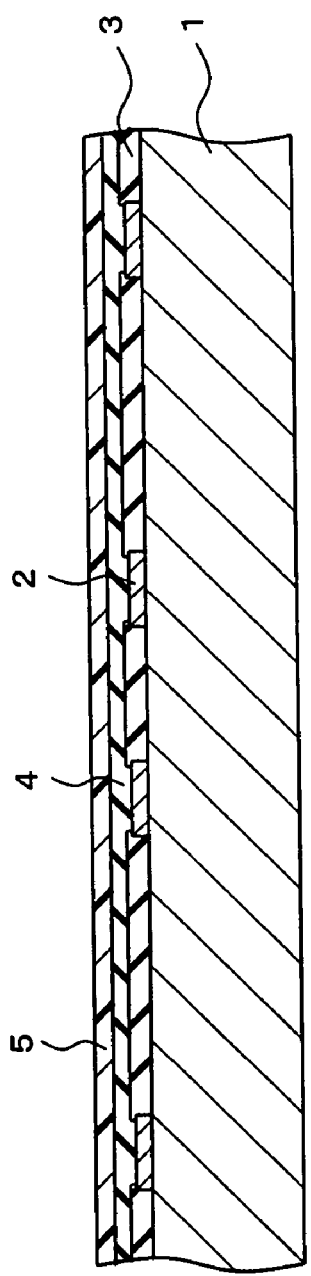
FIGS. 6A to 6C are sectional views sequentially showing the steps next to the steps in FIGS. 5A and 5B.

As shown in FIG. 6A, a photoresist film 5 is formed on the insulating resin layer 4.

Figure 6B:
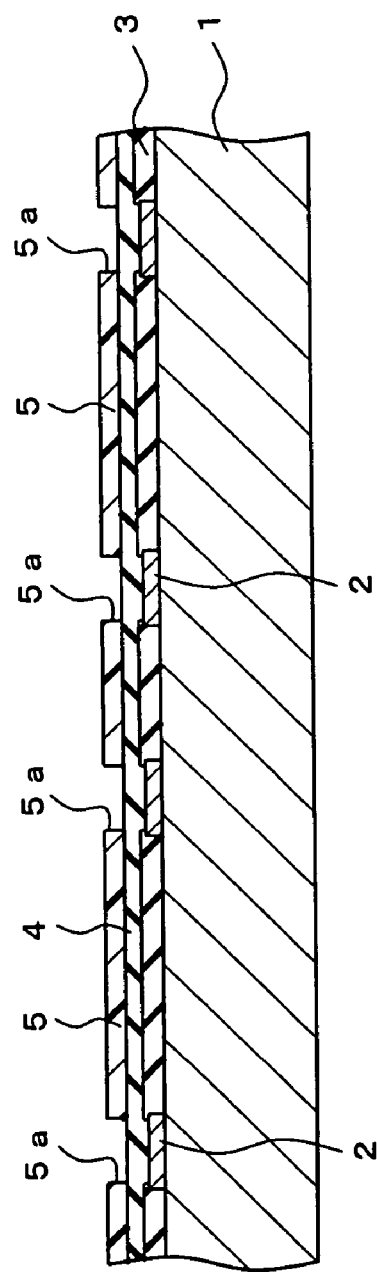

As shown in FIG. 6B, exposure and development are applied to the photoresist film 5 by, e.g., a photolithographic method to pattern the photoresist film 5, thereby forming an opening 5a at a position adjusted to the pad electrode 2.

Figure 6C:
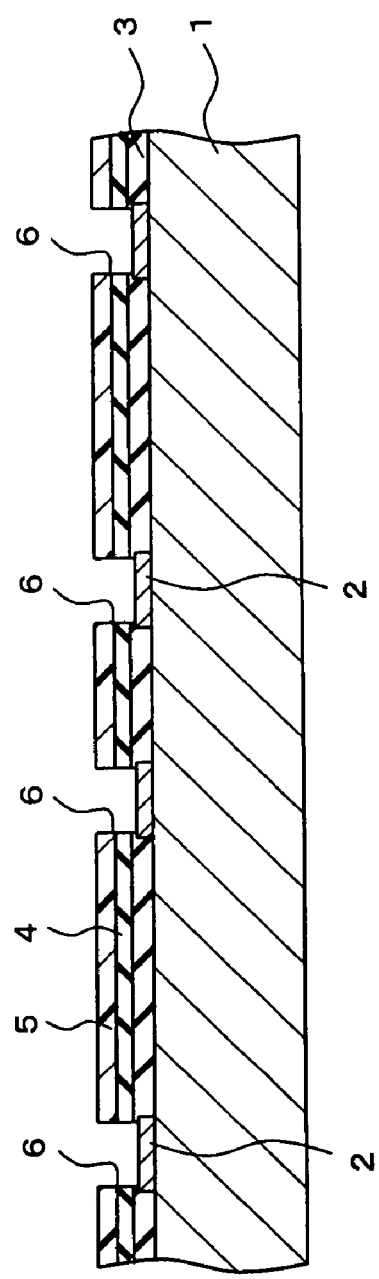

As shown in FIG. 6C, the insulating resin layer 4 is removed by, e.g., an etching method or the like by using the photoresist film 5 as a mask to form an opening 6 reaching the pad electrodes 2.

Figure 7A:
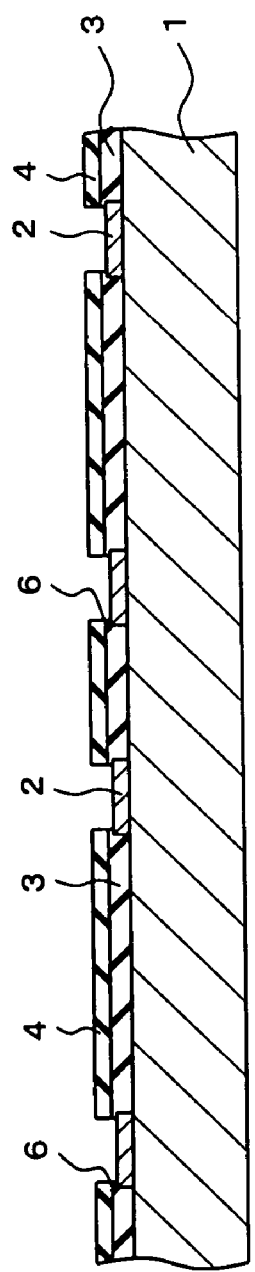
FIGS. 7A to 7C are sectional views sequentially showing the steps next to the steps in FIGS. 6A to 6C.

As shown in FIG. 7A, the photoresist film 5 is removed by peeling. When the insulating resin layer 4 is made of a photosensitive material, the photoresist film 5 need not be formed, and the exposure and developing processes may be directly performed to the insulating resin layer 4 to pattern the insulating resin layer 4, thereby forming the opening 6.

Figure 7B:
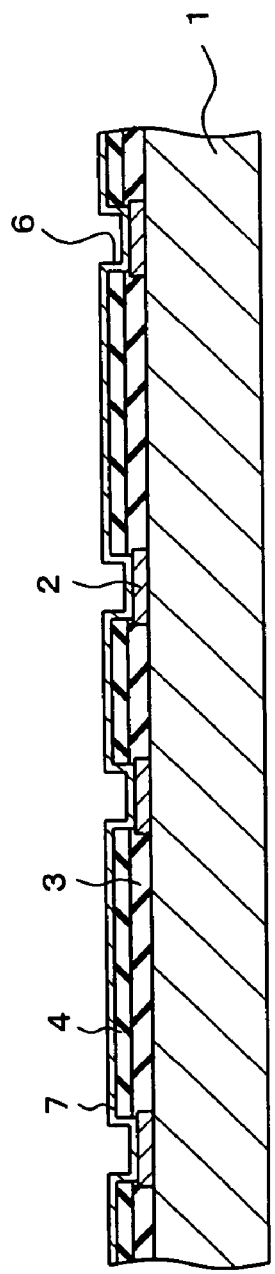

As shown in FIG. 7B, a pad electrode adhesive metal film 7 made of a metal or alloy such as a Ti-based alloy or Cu is formed by, for example, a sputtering method or the like on the entire surface of the semiconductor substrate 1 as an underlying metal thin film layer of the re-wiring layer. The pad electrode adhesive metal film 7 preferably has good adhesive properties to the material of the pad electrodes 2, small metal diffusion between the film 7 and the electrode 2, and good adhesive properties to the insulating resin layer 4.

Figure 7C:
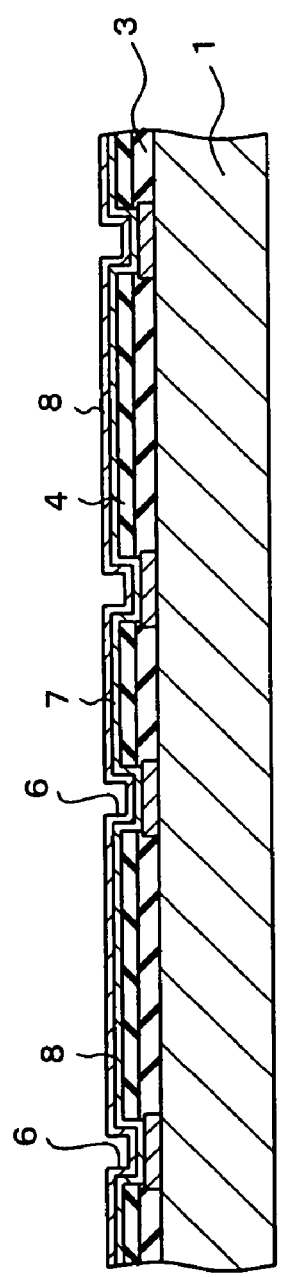

As shown in FIG. 7C, the plating feed layer metal film 8 which functions as a plating feed layer for a re-wiring layer and has a low electric resistance property is formed on the metal film 7 by, e.g., a sputtering method or the like. The plating feed layer metal film 8 is made of, e.g., a metal material such as Cu.

Figure 8A:
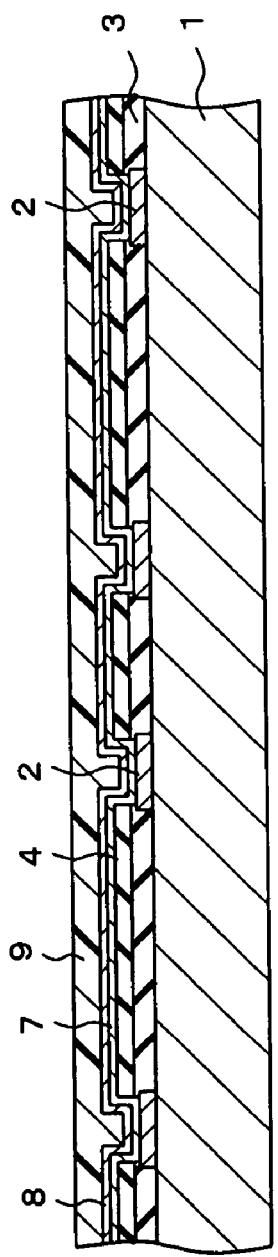
FIGS. 8A to 8C are sectional views sequentially showing the steps next to the steps in FIGS. 7A to 7C.

As shown in FIG. 8A, a photoresist film 9 is formed on the entire surface of the plating feed layer metal film 8 to form a re-wiring layer by an electrolytic plating process.

Figure 8B:
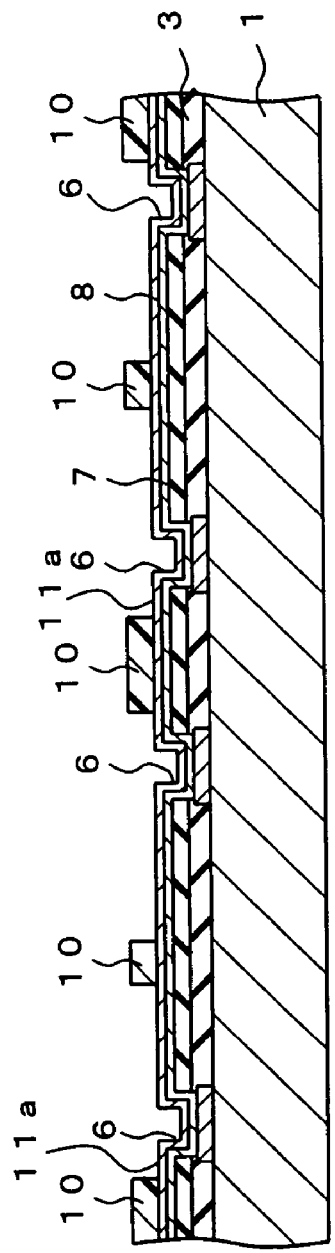

As shown in FIG. 8B, the resultant structure is exposed and developed by, e.g., a photolithographic method to expose the plating feed layer metal film 8 of only a portion corresponding to the re-wiring pattern portion 11a to pattern the photoresist film 9. In this manner, a resist residual portion 10 is left on the plating feed layer metal film 8.

Figure 8C:
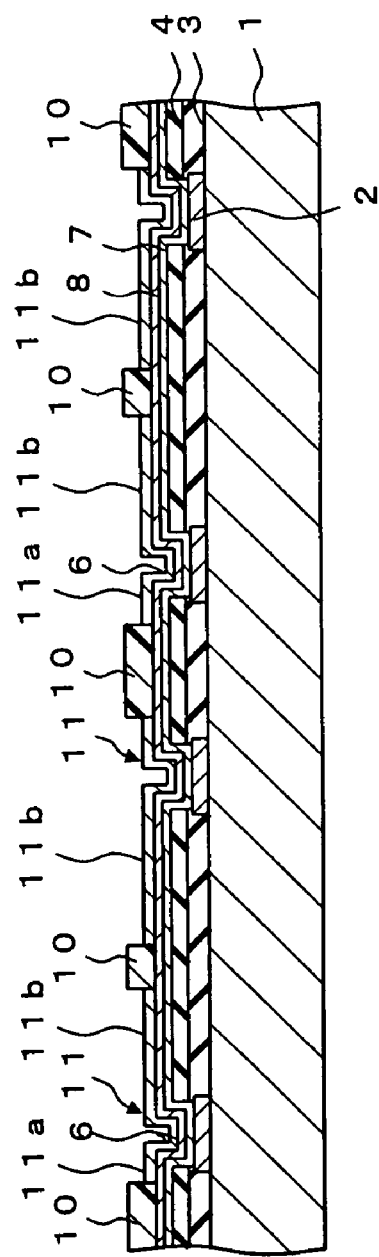

As shown in FIG. 8C, the Cu plating layer 11 is formed on the plating feed layer metal film 8 by, e.g., an electrolytic Cu plating process. In this manner, a wiring layer constituted by the pad electrode adhesive metal film 7, the plating feed layer metal film 8, and the Cu plating layer 11 is formed. This wiring layer is formed like a re-wiring pattern. The external terminal forming land portion 1ib is formed in the re-wiring pattern portion 11a.

Figure 9A:
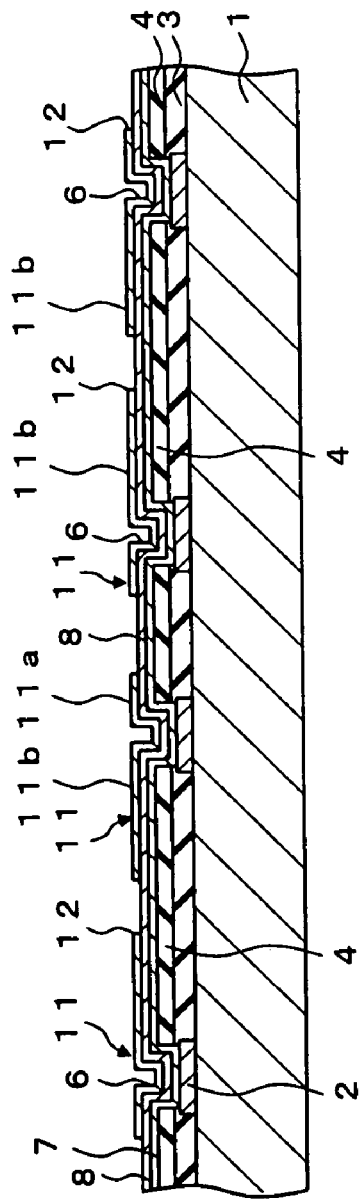
FIGS. 9A to 9C are sectional views sequentially showing the steps next to the steps in FIGS. 8A to 8C.

As shown in FIG. 9A, the resist residual portion 10 subjected to the pattern process is removed to form an opening 12 in the Cu plating layer 11, thereby exposing the plating feed layer metal film 8.

Figure 9B:
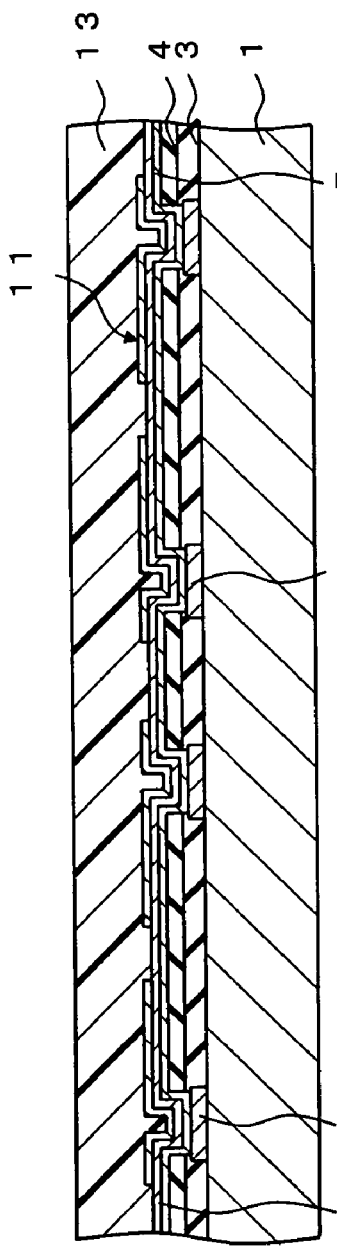

As shown in FIG. 9B, a photoresist film 13 having a large thickness is formed on the entire surface of the semiconductor substrate 1.

Figure 9C:
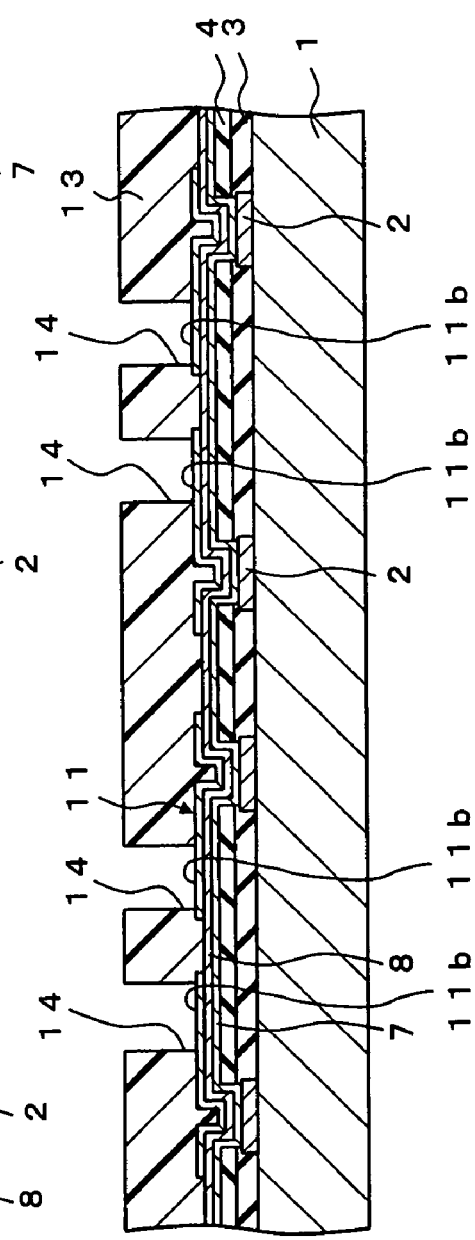

As shown in FIG. 9C, the photoresist film 13 is exposed and developed to partially remove the photoresist film 13, and an opening 14 is formed to expose the external terminal forming land portion 11b. At this time, when the developing properties of the photoresist film 13 are poor, good developing properties may be secured by performing a dry etching process using a plasma surface processing technique to the photoresist film 13.

As shown in FIG. 10A, the plating feed layer metal film 8 is used as a feed layer, the metal post electrode 15 consisting of a metal material such as Cu or Ni is formed in the opening 14 opened on the external terminal forming land portion 11b. At this time, when a variation in the heights of the formed metal post electrodes 15 is large, a dummy solid pattern may be added at the outer periphery of the semiconductor substrate 1 to achieve a means for uniforming a cathode current density distribution in an effective region of the semiconductor substrate 1.

As shown in FIG. 10B, the photoresist film 13 is subjected to a removing process to expose the metal post electrode 15 formed on the external terminal forming land portion 11b.

Figure 11A:
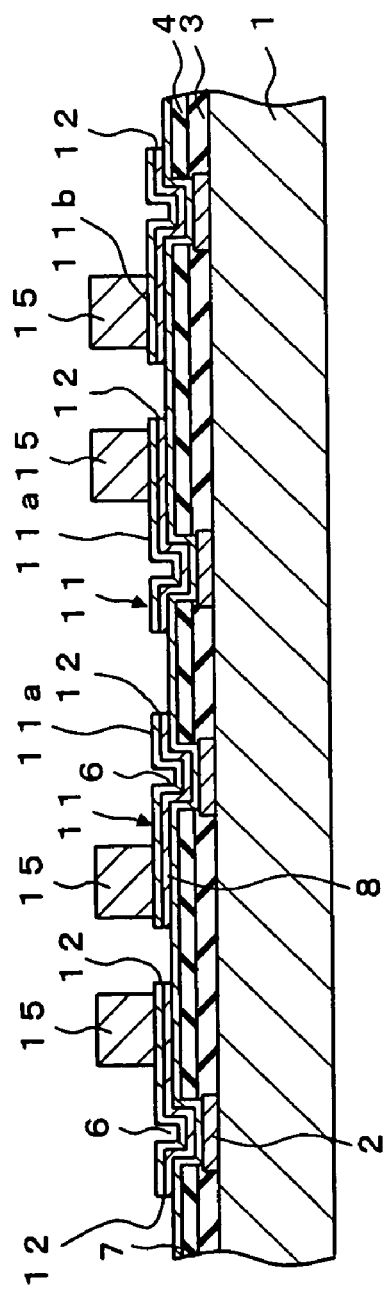
FIGS. 11A and 11B are sectional views sequentially showing the steps next to the steps in FIGS. 10A and 10B.

As shown in FIG. 11A, by using the Cu plating layer 11 as a mask, the plating feed layer metal film 8 on the bottom of the opening 12 is removed by using, e.g., a wet etching method or a dry etching method.

Figure 11B:
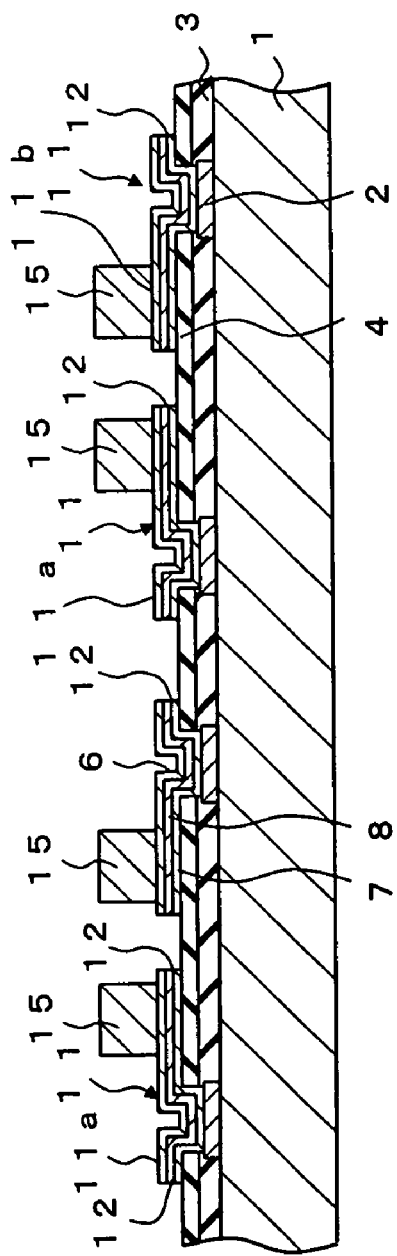

As shown in FIG. 11B, by using the Cu plating layer 11 as a mask, the pad electrode adhesive metal film 7 on the bottom of the opening 12 can be subjected to a removing process to electrically insulate the re-wiring pattern portions 11a from each other.

Figure 12A:
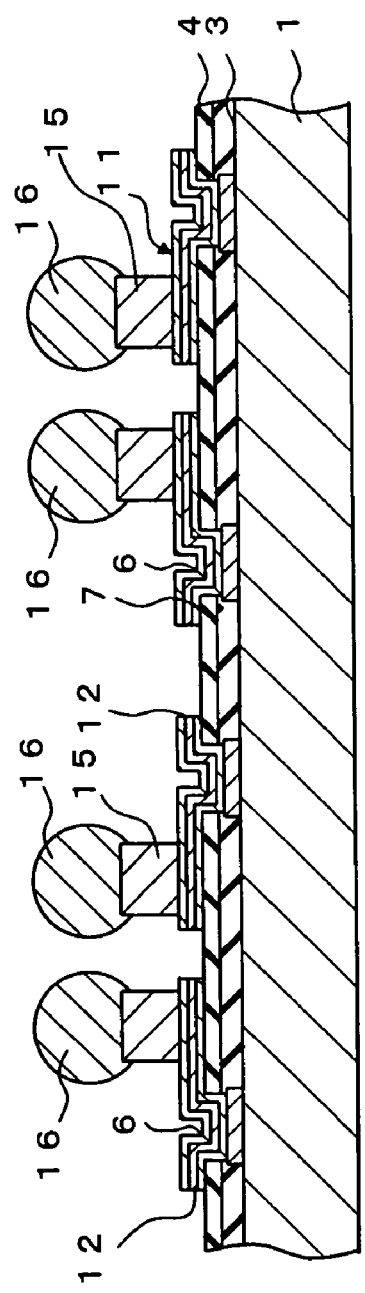
FIGS. 12A and 12B are sectional views sequentially showing the steps next to the steps in FIGS. 11A and 11B.

As shown in FIG. 12A, a flux is supplied onto the metal post electrode 15, and a solder ball (not shown) is mounted and subjected to heating reflow to form the solder bumps 16 on the electrodes 15 as external terminals. At this time, when the activity of the flux is high, after the solder bump 16 is formed, the flux is preferably washed to secure the cleanness of the sample.

Figure 12B:
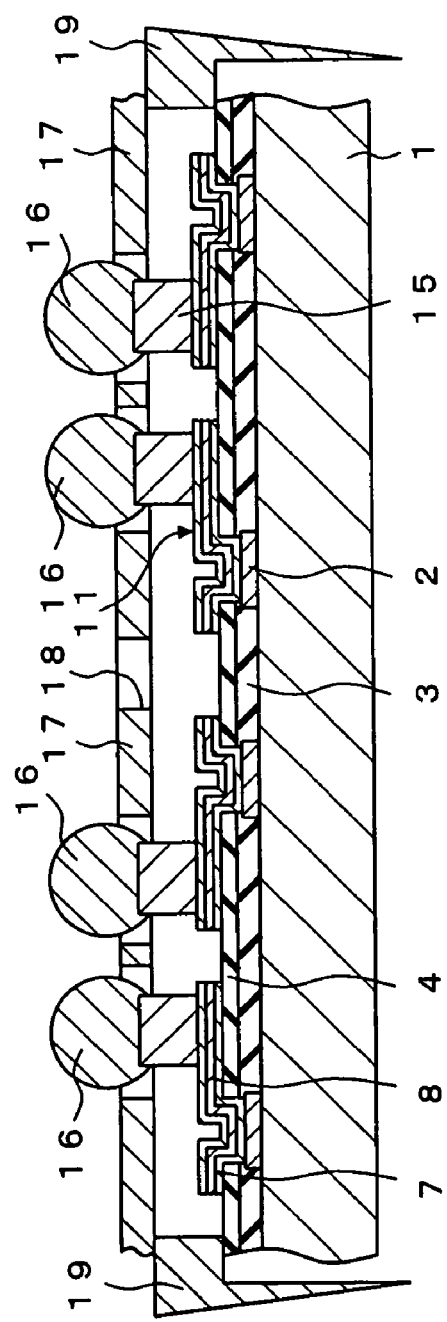

As shown in FIG. 12B, height adjustment jigs 19 each having a predetermined height are arranged on both the sides of the semiconductor substrate 1, and the support plate 17 in which holes each having a diameter larger than that of the solder bump 16 are formed in the same pattern as the arrangement pattern of the solder bumps 16 is arranged on the height adjustment jigs 19 such that the support plate 17 and the inner peripheral surfaces of the holes are not in contact with the metal post electrodes 15 and the solder bumps 16. In this manner, an insulating resin can be filled to reach the periphery of the metal post electrode 15 and the joint portion between the solder bump 16 and the metal post electrode 15 and to have a predetermined thickness. Note that a resin injection portion 18 for injecting an insulating resin is formed in the support plate 17 in advance. As the material of the support plate 17, any one of a conductive material and an insulating material may be used.

As shown in FIG. 13A, an insulating resin is injected from the resin injection portion 18 formed in the support plate 17 to fill a portion between the support plate 17 and the semiconductor substrate 1 with the insulating resin, thereby forming an insulating resin layer 20. In this manner, the periphery of the metal post electrode 15 and the joint portion between the solder bump 16 and the metal post electrode 15 are covered with the insulating resin.

As shown in FIG. 13B, the height adjustment jigs 19 arranged at the ends of the semiconductor substrate 1 are removed. The insulating resin layer 20 to be injected is made of, e.g., a thermosetting resin, the resin may be hardened (cured) under predetermined conditions.

Figure 14:
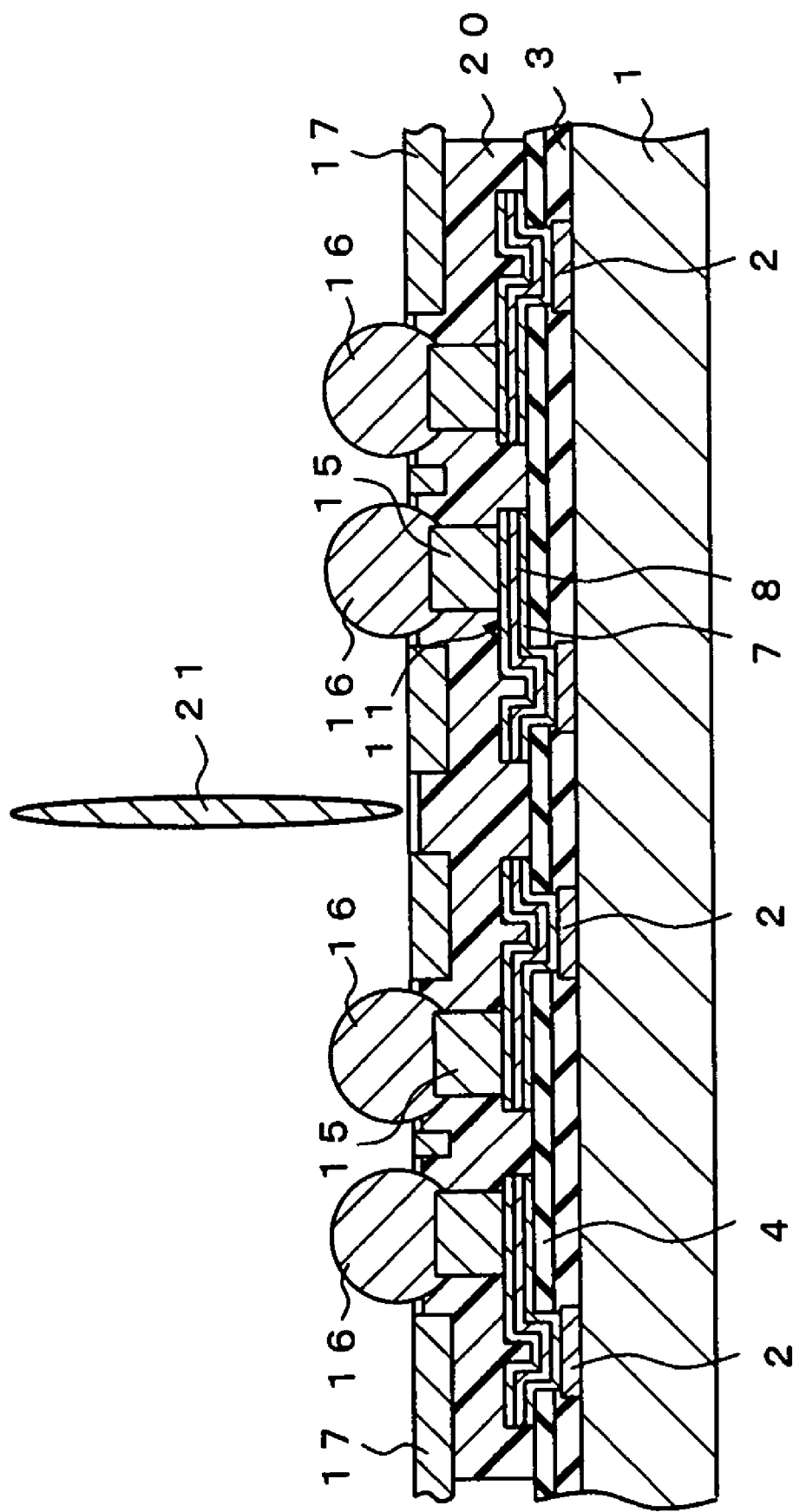
FIG. 14 is a sectional view sequentially showing the step next to the steps in FIGS. 13A and 13B.

As shown in FIG. 14, a disassembling process for cutting the semiconductor substrate 1 into semiconductor chips by a dicing blade 21 to change from the state of the semiconductor substrate 1 to the state of the semiconductor chips is performed. In this manner, a flip-chip type semiconductor device as shown in FIG. 3 can be manufactured.

In this embodiment, since respective packages can be manufactured by the processes in the state of the semiconductor substrate 1, the number of steps can be considerably reduced in comparison with a conventional packaging method for manufacturing packages from the state of small pieces, and the cost can be considerably reduced.

Figure 15:
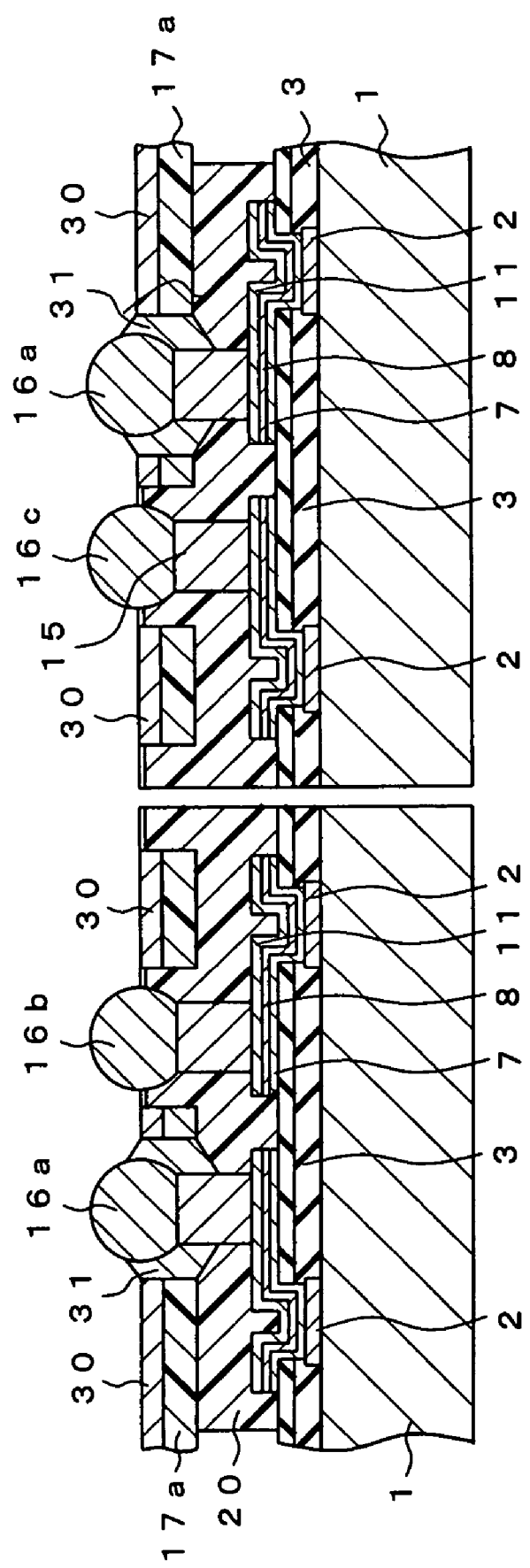
FIG. 15 is a sectional view showing a flip-chip type semiconductor device according to the second embodiment of the present invention.

The second embodiment of the present invention will be described below. FIG. 15 is a sectional view showing a flip-chip type semiconductor device according to the second embodiment of the present invention. The same reference numerals as in FIGS. 3 and 4 denote the same parts in FIG. 15, and a description thereof will be omitted.

In this embodiment, in comparison with the first embodiment, an insulating layer (not shown) made of, i.e., polyimide is formed on a support plate 17a, and a metal foil layer 30 made of, e.g., Cu is formed on the insulating layer. The metal foil layer 30 is arranged like a conductive pattern. The second embodiment is the same as the first embodiment except for the following configuration. That is, of solder bumps 16a, 16b, and 16c, the solder bump 16a serving as a GND external terminal is connected to the metal foil layer 30 on the support plate 17a by burying a hole with a conductive adhesive agent 31. It is determined in advance on the stage of design for a semiconductor element that the solder bumps 16a, 16b, and 16c formed on a metal post electrode 15 serve as a GND external terminal, a Sig (signal) external terminal, and a power supply external terminal which are electric functions of the external terminals.

In this embodiment, in comparison with the first embodiment, the metal foil layer 30 in the support plate 17a having a conductive pattern can be used as a GND plane function. For this reason, improvements in electric characteristics such as a reduction in GND inductance in a package form, an EMI shield effect, a reduction in crosstalk noise, and the like can be achieved.

Figure 16A:
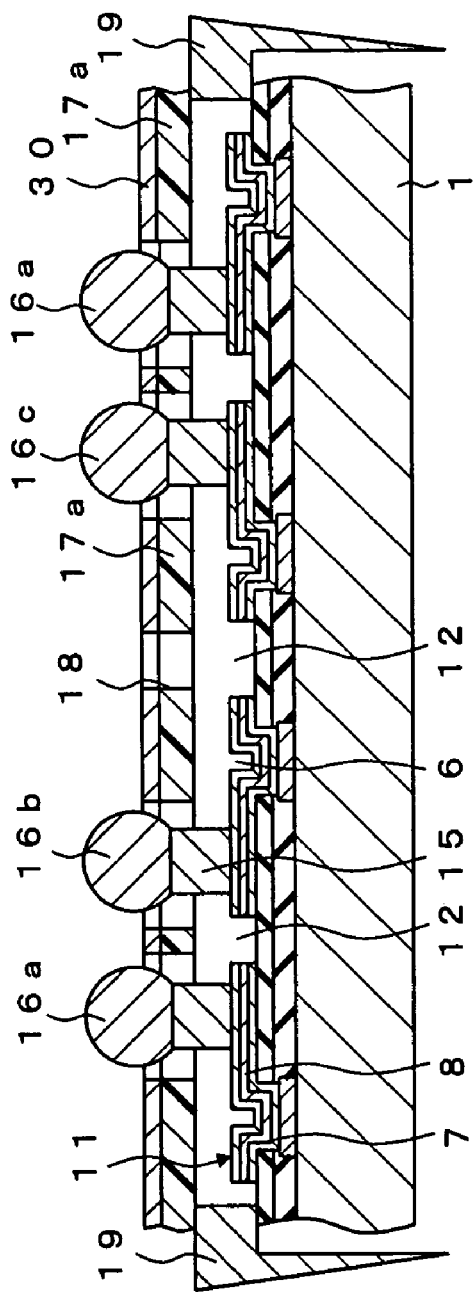
FIGS. 16A and 16B are sectional views sequentially showing steps in a manufacturing a flip-chip type semiconductor device according to the second embodiment of the present invention.
Figure 16B:
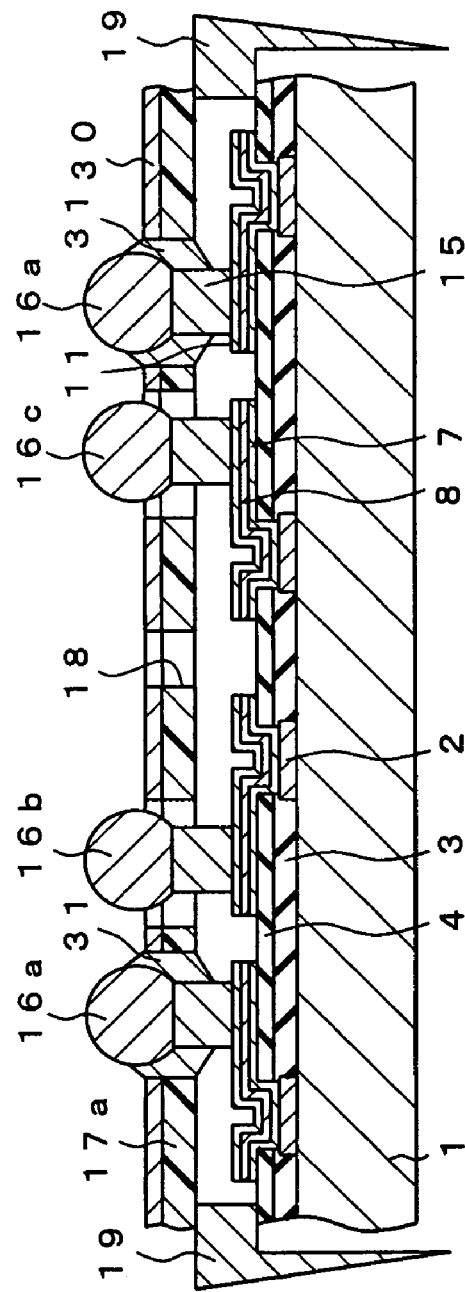
Figure 17A:
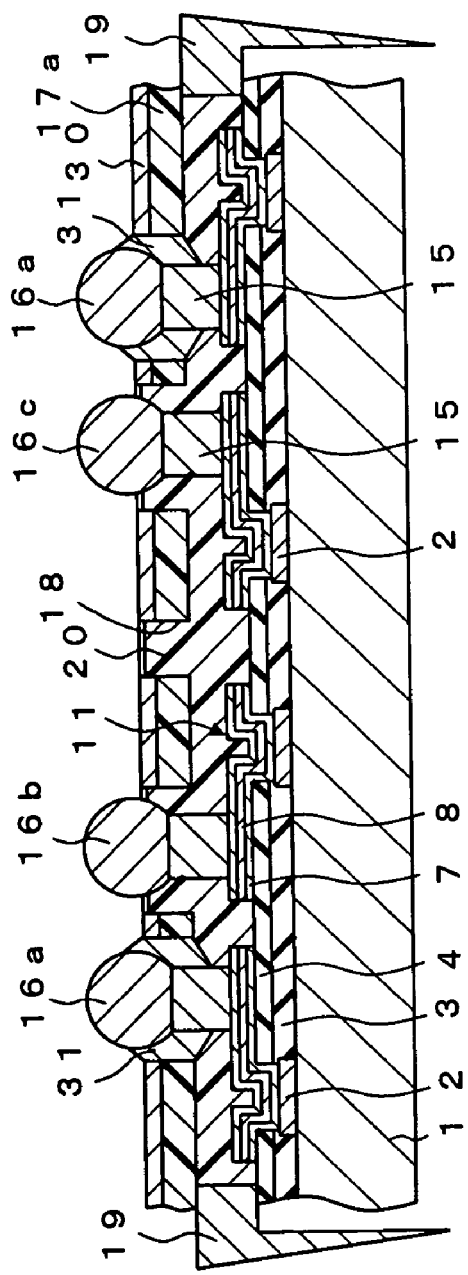
FIGS. 17A and 17B are sectional views sequentially showing the steps next to the steps in FIGS. 16A and 16B.
Figure 17B:
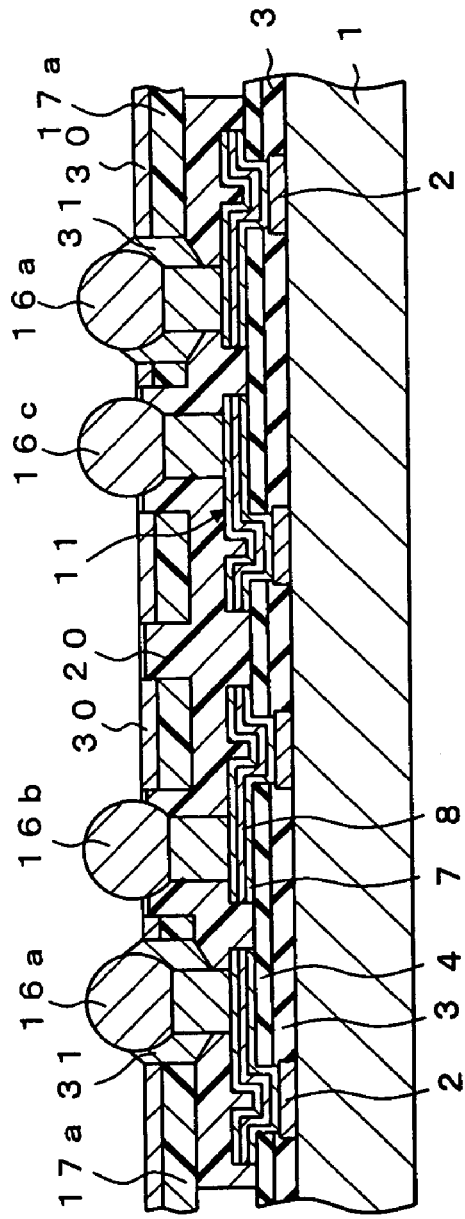

A method of manufacturing a flip-chip type semiconductor device according to this embodiment will be described below. FIGS. 16A and 16B are sectional views sequentially showing steps in manufacturing a flip-chip type semiconductor device according to the second embodiment of the present invention, and FIGS. 17A and 17B are sectional views sequentially showing the steps next to the steps in FIGS. 16A and 16B.

In this embodiment, the same steps as the steps up to the step shown in FIG. 12A in the manufacturing method of the first embodiment are used. An explanation will be started from the step next to the step shown in FIG. 12A.

As shown in FIG. 16A, height adjustment jigs 19 each having a predetermined height are arranged on both the sides of the semiconductor substrate 1, and the support plate 17a in which holes having diameters larger than that of the solder bumps 16a, 16b, and 16c are formed in the same pattern as the arrangement pattern of the solder bumps 16a, 16b, and 16c is arranged on the height adjustment jigs 19 such that the support plate 17a and the inner peripheral surfaces of the holes are not in contact with the metal post electrodes 15 and the solder bumps 16a, 16b, and 16c. In this manner, an insulating resin can be filled to reach the periphery of the metal post electrode 15 and the joint portions between the solder bumps 16a, 16b, and 16c and the metal post electrode 15 and to have a predetermined thickness. A resin injection portion 18 for injecting an insulating resin is formed in the support plate 17a in advance. In addition, an insulating layer (not shown) consisting of, e.g., polyimide is formed on the support plate 17a, and a metal foil layer 30 consisting of, e.g., Cu is formed on the insulating layer. The metal foil layer 30 is formed like a conductive pattern. As the material of the support plate 17a, any one of a conductive material and an insulating material may be used.

As shown in FIG. 16B, the conductive adhesive agent 31 is buried into gap portions between the solder bump 16a, serving as the GND external terminal, of the solder bumps 16a, 16b, and 16c and the holes formed in the support plate 17a having a conductive pattern. At this time, a thermosetting process may be performed to the conductive adhesive agent 31 under predetermined conditions as needed.

As shown in FIG. 17A, an insulating resin is injected from the resin injection portion 18 of the support plate 17a having a conductive pattern, and the insulating resin is filled to reach the peripheries of the metal post electrodes 15 and the joint portions between the solder bumps 16a, 16b, 16c and the metal post electrodes 15 to form an insulating resin layer 20 between the support plate 17a and the semiconductor substrate 1. At this time, as a method of forming the insulating resin layer 20, when a liquid resin to be injected as the insulating resin layer 20 has excellent fluidity characteristics, the insulating resin can be injected from the resin injection portion 18 by potting. In this manner, the insulating resin can be easily filled between the semiconductor substrate 1 and the support plate 17a.

As shown in FIG. 17B, the height adjustment jigs 19 arranged on both sides of the semiconductor substrate 1 are removed. At this time, when the insulating resin layer 20 is made of a thermosetting resin, a resin hardening process may be performed under predetermined conditions, and the height adjustment jigs 19 may be removed.

As in the first embodiment, a disassembling process for cutting the semiconductor substrate 1 into semiconductor chips by a dicing blade 21 to change from the state of the semiconductor substrate 1 to the state of the semiconductor chips is performed. In this manner, a flip-chip type semiconductor device as shown in FIG. 15 can be manufactured.

In this embodiment, as described above, flip-chip type semiconductor devices having electric characteristics which are more excellent than those of the first embodiment can be manufactured as packages by the processes at wafer level. For this reason, since the number of steps can be considerably reduced in comparison with a conventional packaging method for manufacturing packages from the state of small pieces, the cost can be considerably reduced.

In any one of the embodiments, although a polyimide-based resin is used as the material of the insulating resin layer 20, the material is not limited to the polyimide-based resin. The insulating resin layer 20 may contain at least one resin selected from the group consisting of an epoxy-based resin, a silicon-based resin, a polyolefin-based resin, a cyanate ester-based resin, a phenol-based resin, a naphthalene-based resin, and a fluorene-based resin.

What is claimed is:

1. A method of manufacturing a flip-chip type semiconductor device comprising the steps of:
   forming a pad electrode on a semiconductor substrate;
   forming an insulating film on the entire surface of the semiconductor substrate and removing the insulating film on the pad electrode to form an opening;
   forming a metal thin film layer on the entire surface of the semiconductor substrate and patterning the metal thin film layer to form a wiring portion;
   forming a resist film on the entire surface of the semiconductor substrate, patterning the resist film to remove the resist film on the wiring portion, and forming an opening to form an electrode in the opening;
   forming a metal bump on the electrode;
   arranging a support plate above the semiconductor substrate with an appropriate interval between said support plate and said semiconductor substrate, said support plate having holes each having a diameter larger than the diameter of the metal bump and formed at positions adjusted to the positions where the metal bump are arranged; and
   injecting an insulating resin between the semiconductor substrate and the support plate.

2. A method of manufacturing a flip-chip type semiconductor device according to claim 1, wherein the support plate is made of a conductive material, and an insulating film and a metal film are formed on the support plate in the order named, and said method comprises burying a conductive adhesive agent into the hole of the support plate located at the metal bump, having the ground potential, of the metal bumps is held.

3. A method of manufacturing a flip-chip type semiconductor device according to claim 1, wherein the support plate is made of an insulating material, and a metal film is formed on the surface of the insulating material, and said method comprises burying a conductive adhesive agent into a hole of the support plate located at a metal bump, having a ground potential, of the metal bumps.

4. A method of manufacturing a flip-chip type semiconductor device according to claim 1, wherein the support plate is arranged above the semiconductor substrate by arranging jigs each having an appropriate thickness at both ends of the semiconductor substrate and placing the support plate on said jigs.

5. A method of manufacturing a flip-chip type semiconductor device according to claim 1, wherein a periphery of a joint portion between the metal bump and the electrode is covered with the insulating resin layer.

6. A method of manufacturing a flip-chip type semiconductor device according to claim 1, wherein the insulating resin layer contains at least one resin selected from the group consisting of an epoxy-based resin, a silicon based resin, a polymide-based resin, a polyolefin-based resin, a cyanate ester-based resin, a phenol-based resin, a naphthalene-based resin, and a fluorene-based resin.

7. A method of manufacturing a flip-chip type semiconductor device according to claim 1, wherein the insulating film is made of a photosensitive material.

8. A method of manufacturing a flip-chip type semiconductor device according to claim 1, wherein the insulating film has a thermal decomposition temperature of not less than 200 degrees Celsius.

9. A method of manufacturing a flip-chip type semiconductor device comprising the steps of:
   providing a semiconductor substrate including a pad electrode and an insulating film on a first area of a surface of the semiconductor substrate, the first surface not including the pad electrode;
   providing a patterned metal thin film layer on a second area of the surface of the semiconductor substrate to form a wiring portion;
   providing a patterned resist film on a third area of the surface of the semiconductor substrate, the third area not overlapping the first and second areas; providing at least one metal bump on the electrode;
   arranging a support plate above and spaced away from the semiconductor substrate, the support plate having at least one hole; and
   injecting an insulating resin between the semiconductor substrate and the support plate; wherein a first number of holes is equal to a second number of metal bumps, each hole includes a first diameter larger than a second diameter of each metal bump, and each hole is at a first position corresponding to a second position of each metal bump.

10. A method of manufacturing a flip-chip type semiconductor device according to claim 9, wherein the support plate is made of a conductive material, and an insulating film and a metal film are formed on the support plate in the order named, and said method comprises burying a conductive adhesive agent into the hole of the support plate located at the metal bump, having the ground potential, of the metal bumps is held.

11. A method of manufacturing a flip-chip type semiconductor device according to claim 9, wherein the support plate is made of an insulating material, and a metal film is formed on the surface of the insulating material, and said method comprises burying a conductive adhesive agent into a hole of the support plate located at a metal bump, having a ground potential, of the metal bumps.

12. A method of manufacturing a flip-chip type semiconductor device according to claim 9, wherein the support plate is arranged above the semiconductor substrate by arranging jigs each having an appropriate thickness at both ends of the semiconductor substrate and placing the support plate on said jigs.

* * * * *